(12) United States Patent
Nakajima

(10) Patent No.: US 6,422,173 B1
(45) Date of Patent: Jul. 23, 2002

(54) APPARATUS AND METHODS FOR ACTIVELY CONTROLLING RF PEAK-TO-PEAK VOLTAGE IN AN INDUCTIVELY COUPLED PLASMA ETCHING SYSTEM

(75) Inventor: Shu Nakajima, Kanagawa-ken (JP)

(73) Assignee: Lam Research Corporation, Fremont, CA (US)

( * ) Notice: Subject to any disclaimer, the term of this patent is extended or adjusted under 35 U.S.C. 154(b) by 42 days.

(21) Appl. No.: 09/676,462

(22) Filed: Sep. 29, 2000

Related U.S. Application Data

(63) Continuation-in-part of application No. 09/608,883, filed on Jun. 30, 2000.

(51) Int. Cl.[7] .................. C23C 16/507; C23C 16/505
(52) U.S. Cl. ..................... 118/723 I; 118/723 AN; 118/723 E; 118/723 R; 156/345.48; 156/345.51
(58) Field of Search .............. 118/715, 723 E, 118/723 I, 723 IR, 723 R, 723 AN; 204/192.12, 192.37, 298.15, 298.34; 216/68, 61, 78; 219/121.43; 315/111.21, 111.51; 438/513, 710; 156/345; 422/168

(56) References Cited

U.S. PATENT DOCUMENTS

| | | | | |
|---|---|---|---|---|
| 5,534,231 | A | | 7/1996 | Savas .................. 216/67 |
| 5,540,800 | A | | 7/1996 | Qian .................. 156/345 |
| 5,650,032 | A | * | 7/1997 | Keller et al. ............ 156/345 |
| 5,824,604 | A | * | 10/1998 | Bar-Gadda ............... 438/725 |
| 5,964,949 | A | * | 10/1999 | Savas ................ 118/723 I |
| 6,030,667 | A | * | 2/2000 | Nakagawa et al. ........ 427/569 |
| 6,077,384 | A | * | 6/2000 | Collins et al. ............. 156/345 |
| 6,149,760 | A | * | 11/2000 | Hama .................. 156/345 |
| 6,180,019 | B1 | * | 1/2001 | Kazumi et al. ............ 216/78 |
| 6,213,050 | B1 | * | 4/2001 | Liu et al. ............ 118/723 IR |
| 6,245,202 | B1 | * | 6/2001 | Edamura et al. ........ 204/298.06 |
| 6,254,738 | B1 | * | 7/2001 | Stimson et al. ........ 204/192.12 |
| 6,262,538 | B1 | * | 7/2001 | Keller .................. 315/111.21 |
| 6,280,563 | B1 | * | 8/2001 | Baldwin, Jr. et al. ....... 156/345 |
| 6,286,451 | B1 | * | 9/2001 | Ishikawa et al. .......... 118/723 I |
| 2001/0042595 | A1 | * | 11/2001 | Kazumi et al. ............ 156/345 |

FOREIGN PATENT DOCUMENTS

WO  WO 99 53733  10/1999

OTHER PUBLICATIONS

Patrick, et al, "Characterization of an aluminum etching process in an inductively coupled discharge using measurements of discharge impedance and current and voltage sensors", J.Vac.Sci. Technol. A 15(3), May/Jun. 1997, pp. 1250–1256.*

Abstract of Japanese Patent Publication 11–251303, Patent Abstracts of Japan, vol. 1999, No. 14, Dec. 22, 1999.

* cited by examiner

*Primary Examiner*—Gregory Mills
*Assistant Examiner*—Rudy Zervigon
(74) *Attorney, Agent, or Firm*—Martine & Penilla, LLP

(57) ABSTRACT

An inductively coupled plasma etching apparatus includes a chamber and a window for sealing a top opening of the chamber. The window has an inner surface that is exposed to an internal region of the chamber. A metal plate, which acts as a Faraday shield, is disposed above and spaced apart from the window. A coil is disposed above and spaced apart from the metal plate. The coil is conductively connected to the metal plate at a connection location that is configured to generate a peak-to-peak voltage on the metal plate that optimally reduces sputtering of the inner surface of the window while substantially simultaneously preventing deposition of etch byproducts on the inner surface of the window. In another embodiment, the apparatus includes a controller for externally applying a peak-to-peak voltage to the metal plate. The controller includes an oscillation circuit, a matching circuit, an RF generator, and a feedback control for monitoring the applied peak-to-peak voltage. Methods for optimizing operation of an inductively coupled plasma etching apparatus also are described.

17 Claims, 13 Drawing Sheets

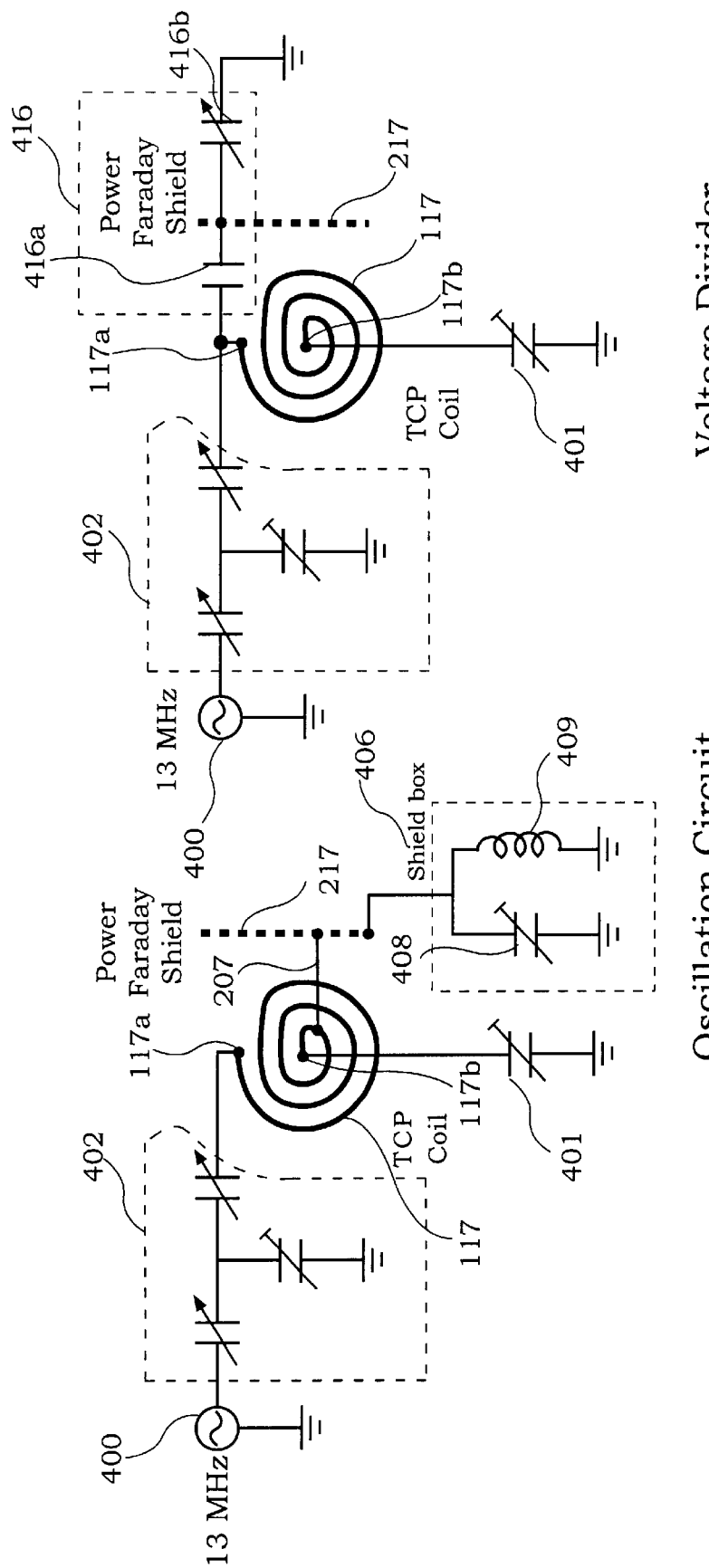
FIG. 8A  Voltage Divider
FIG. 7A  Oscillation Circuit

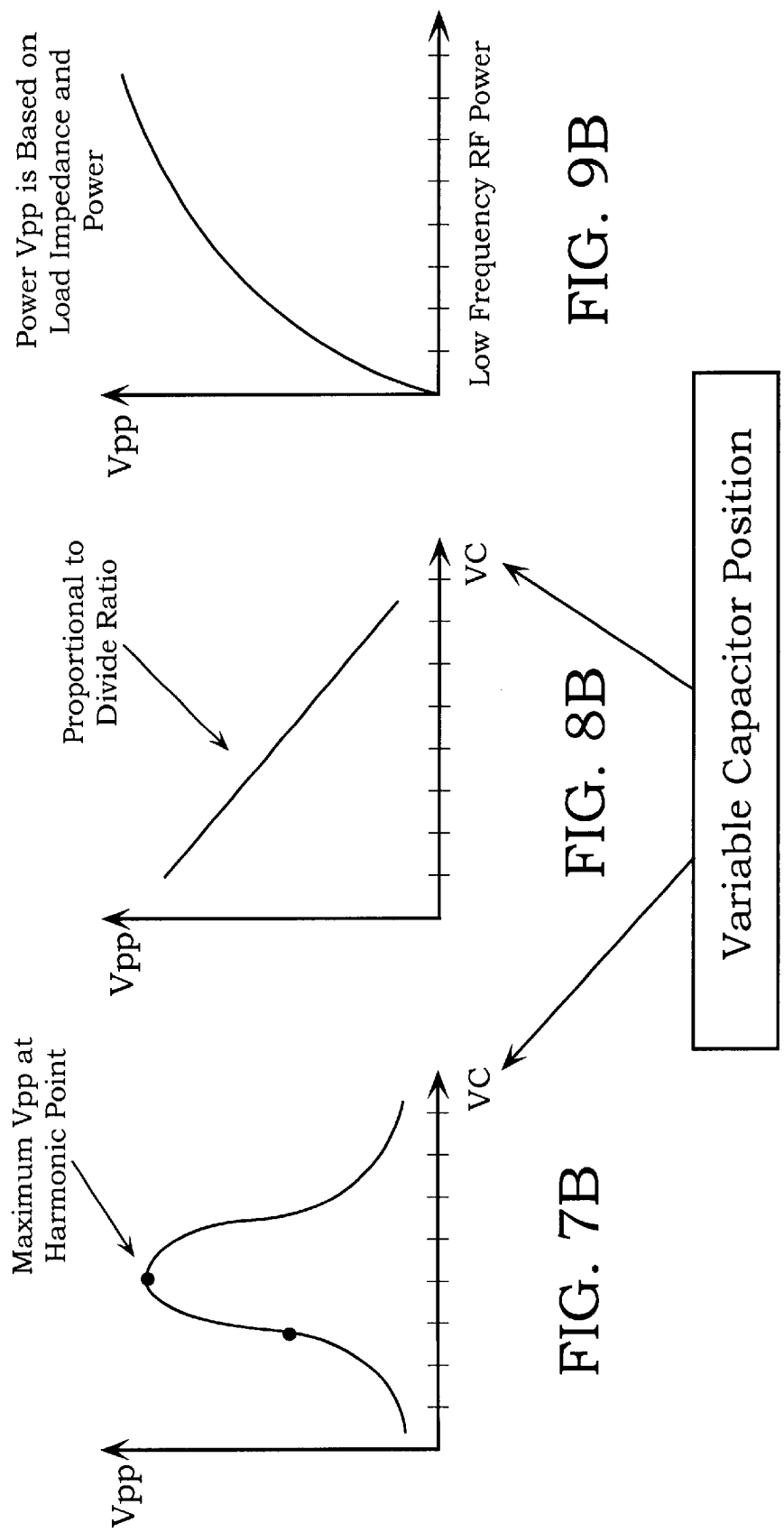

APPARATUS AND METHODS FOR ACTIVELY CONTROLLING RF PEAK-TO-PEAK VOLTAGE IN AN INDUCTIVELY COUPLED PLASMA ETCHING SYSTEM

CROSS-REFERENCE TO RELATED APPLICATIONS

This application is a continuation-in-part of application Ser. No. 09/608,883, filed on Jun. 30, 2000. The disclosure of this application is incorporated herein by reference.

BACKGROUND OF THE INVENTION

The present invention relates generally to semiconductor fabrication and, more particularly, to apparatus and methods for controlling the plasma behavior inside of plasma etching chambers.

In semiconductor manufacturing processes, etching processes, insulation film formation, and diffusion processes are repeatedly carried out. As is well known to those skilled in the art, there are two types of etching processes: wet etching and dry etching. Dry etching is typically implemented by using an inductively coupled plasma etching apparatus such as shown in FIG. 1A.

In the inductively coupled plasma etching apparatus shown in FIG. 1A, a reactant gas is first led into chamber 20 through a gas lead-in port (not shown). High frequency power is then applied from a power supply (not shown) to coil 17. Semiconductor wafer 11 is mounted on chuck 19 provided inside chamber 20. Coil 17 is held on the upper portion of the chamber by spacers 13, which are formed of an insulating material. In operation, high frequency (RF) current passing through coil 17 induces an electromagnetic current into chamber 20, and the electromagnetic current acts on the reactant gas to generate a plasma.

The plasma contains various types of radicals and the chemical reaction of the positive/negative ions is used to etch semiconductor wafer 11 itself or an insulation film formed on the wafer. During the etching process, coil 17 carries out a function that corresponds to that of the primary coil of a transformer while the plasma in chamber 20 carries out a function that corresponds to that of the secondary coil of the transformer. The reaction product generated by the etching process is discarded via exhaust port 15.

When etching one of the recently developed device materials (e.g., platinum, ruthenium, and the like), the reaction product generated may be a nonvolatile substance (e.g., $RuO_2$). In some cases, the reaction product may adhere to surface 10a of TCP window 10. If the reaction product is conductive, then the film of reaction product on surface 10a may electrically shield the electromagnetic current in the chamber. Consequently, the plasma does not strike well after several wafers are etched and the etching process must be discontinued.

In an effort to avoid this problem, a method for sputtering the reaction product adhered to surface 10a of TCP window 10 by using the plasma has been developed. In the inductively coupled plasma etching apparatus shown in FIG. 1A, however, the electromagnetic current induced by the RF current generates a distribution voltage having a standing wave in the vicinity of TCP window 10. This is problematic because it causes the deposition and sputtering of the reaction product to become nonuniform.

FIGS. 1B and 1C illustrate the inherent nonuniformity of the deposition and sputtering on the TCP window in the inductively coupled plasma etching apparatus shown in FIG. 1A. In FIG. 1B, coil 17 is indicated by boxes having either an "x" or a "●" therein. The boxes having an "x" therein indicate that the coil extends into the page. The boxes having a "●" therein indicate that the coil extends out of the page. As shown in FIG. 1B, some portions of surface 10a of TCP window 10 are subjected to excess sputtering and other portions of the surface are subjected to excess deposition. Excess sputtering occurs in the regions where a relatively large amount of energy is added to the ions in the plasma because the amplitude of the acceleration voltage due to the standing wave at the location is high. As shown in the graph in the lower part of FIG. 1C, the amplitude of standing wave 24 is high at points 24a and 24b, which correspond to ends 17a and 17b, respectively, of coil 17, as shown in the upper part of FIG. 1C. Excess deposition occurs in the regions where only a relatively small amount of energy is added to the ions in the plasma because the amplitude of the standing wave is low. As shown in the graph in the lower part of FIG. 1C, the amplitude of standing wave 24 is low in the region proximate to point 22, which is the node of the standing wave.

Nonuniform deposition and sputtering on the TCP window is undesirable for a number of reasons. Excessive deposition is undesirable because, as discussed above, the presence of an electrically conductive film on the surface of the TCP window can electrically shield the electromagnetic current in the chamber and thereby disable the etching process. In addition, excessive deposition often causes particle problems (particles flake off on the wafer) and, consequently, increases the frequency with which the chamber must be subjected to dry and wet cleanings. Frequent cleaning of the chamber is particularly undesirable because it sacrifices the tool's available up time and thereby reduces throughput. Excessive sputtering is undesirable because the ion bombardment can cause erosion of the TCP window, which is typically made of quartz or alumina. Such erosion not only shortens the lifetime of the TCP window, but also generates particles, which can contaminate the wafer and introduce unwanted chemical species into the process environment. The presence of unwanted chemical species in the process environment is particularly undesirable because it leads to poor reproducibility of the process conditions.

In view of the foregoing, there is a need for an inductively coupled plasma etching apparatus that prevents substantial deposition of electrically conductive reaction products on the surface of the TCP window without causing excess erosion of the TCP window.

SUMMARY OF THE INVENTION

Broadly speaking, the present invention provides an inductively coupled plasma etching apparatus that uniformly adds energy to the ions in the plasma in the vicinity of a wall of the chamber in which the plasma is generated.

In one aspect of the invention, a first type of inductively coupled plasma etching apparatus is provided. This inductively coupled plasma etching apparatus includes a chamber and a window for sealing a top opening of the chamber. The window has an inner surface that is exposed to an internal region of the chamber. A metal plate, which acts as a Faraday shield, is disposed above and spaced apart from the window. A coil is disposed above and spaced apart from the metal plate. The coil is conductively connected to the metal plate at a connection location that is configured to generate a peak-to-peak voltage on the metal plate that optimally reduces sputtering of the inner surface of the window while substantially simultaneously preventing deposition of etch byproducts on the inner surface of the window.

In one embodiment, the inductively coupled plasma etching apparatus further includes a coil input terminal for receiving RF power and a coil output terminal. In this embodiment, the connection location is defined between the coil input terminal and the coil output terminal. In one embodiment, the connection location is more proximate to the coil output terminal than to the coil input terminal. In one embodiment, the inductively coupled plasma etching apparatus further includes an RF generator, a match circuit network coupled between the RF generator and the coil input terminal, and a variable capacitor coupled between ground and the coil output terminal.

In one embodiment, the inductively coupled plasma etching apparatus further includes an oscillation circuit coupled to the metal plate. The oscillation circuit is controllable so that the peak-to-peak voltage on the metal plate may be adjusted. In one embodiment, the oscillation circuit includes a variable capacitor that can be adjusted to control the peak-to-peak voltage along a harmonic point. In another embodiment, the inductively coupled plasma etching apparatus further includes a voltage divider circuit coupled to the metal plate. The voltage divider circuit is controllable so that the peak-to-peak voltage may be adjusted. In one embodiment, the voltage divider circuit includes a variable capacitor that can be adjusted to control the peak-to-peak voltage along a plot that decreases the peak-to-peak voltage as capacitance of the variable capacitor increases.

In one embodiment, the inductively coupled plasma etching apparatus includes a chamber lid that is configured to have attached thereto the metal plate and the coil. The chamber lid may be attached by hinges that enable opening and closing of the chamber lid. When in a closed position, the chamber lid places the metal plate proximate to the window in preparation for operation.

In another aspect of the invention, a second type of inductively coupled plasma etching apparatus is provided. This inductively coupled plasma etching apparatus includes a chamber and a window for sealing a top opening of the chamber. The window has an inner surface that is exposed to an internal region of the chamber. A metal plate, which acts as a Faraday shield, is disposed above and spaced apart from the window. A coil is disposed above and spaced apart from the metal plate. The apparatus also includes a controller for externally applying a peak-to-peak voltage to the metal plate. The controller includes an oscillation circuit, a matching circuit, an RF generator, and a feedback control for monitoring the applied peak-to-peak voltage.

In one embodiment, the externally applied peak-to-peak voltage is adjustable so as to reduce sputtering of the inner surface of the window while substantially simultaneously preventing deposition of etch byproducts on the inner surface of the window. In one embodiment, the inductively coupled plasma etching apparatus further includes a coil input terminal for receiving RF power and a coil output terminal. In one embodiment, the inductively coupled plasma etching apparatus further includes an RF generator, a match circuit network coupled between the RF generator and the coil input terminal, and a variable capacitor coupled between ground and the coil output terminal.

In one embodiment, the metal plate is connected to the window by dielectric spacers. In one embodiment, the inductively coupled plasma etching apparatus includes a chamber lid that is configured to have attached thereto the metal plate and the coil. The chamber lid may be attached by hinges that enable opening and closing of the chamber lid. When in a closed position, the chamber lid places the metal plate proximate to the window in preparation for operation. When in an open position, the chamber lid places the metal plate away from the window for visual inspection of the window and servicing of the chamber.

In accordance with yet another aspect of the invention, a first method for optimizing operation of an inductively coupled plasma etching apparatus is provided. In this method, a chamber for etching a wafer is supplied. A window is attached to a top opening of the chamber. The window has an outer surface and an inner surface that is exposed to an inner region of the chamber. A coil is placed over the window and a metal plate is placed over the outer surface of the window. The metal plate is positioned in a spaced apart relationship between the coil and the outer surface of the window. The metal plate is conductively connected to a connection location on the coil. The connection location is between an input terminal and an output terminal and is optimally selected so as to produce substantially uniform incident ion energy proximate to the inner surface of the window. The substantially uniform incident ion energy is configured to reduce sputtering of the inner surface of the window while substantially simultaneously preventing deposition of etch byproducts on the inner surface of the window.

In accordance with a still further aspect of the invention, a second method for optimizing operation of an inductively coupled plasma etching apparatus is provided. In this method, a chamber for etching a wafer is supplied. A window is attached to a top opening of the chamber. The window has an outer surface and an inner surface that is exposed to an inner region of the chamber. A coil is placed over the window and a metal plate is placed over the outer surface of the window. The metal plate is positioned in a spaced apart relationship between the coil and the outer surface of the window. A controlled peak-to-peak voltage is applied to the metal plate so as to produce substantially uniform incident ion energy proximate to the inner surface of the window. The substantially uniform incident ion energy is configured to reduce sputtering of the inner surface of the window while substantially simultaneously preventing deposition of etch byproducts on the inner surface of the window.

The apparatus and methods of the present invention provide numerous advantages. Most notably, the apparatus and methods of the present invention uniformly prevent the deposition of electrically conductive reaction products, e.g., $RuO_2$, on the inner surface of the upper wall (e.g., TCP window) of a chamber in an inductively coupled plasma etching system. This increases throughput in the plasma etching of recently developed device materials, e.g., Ru, because the plasma etching operation does not have to be stopped to clean the walls of the chamber after only a few wafers have been processed. In addition, the apparatus and methods of the present invention also uniformly prevent sputtering of the inner surface of the upper wall (e.g., TCP window) of a chamber in an inductively coupled plasma etching system. This increases the reproducibility of the process conditions by avoiding the generation of particles and the introduction of unwanted chemical species into the process environment.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

FIG. 7A is a simplified schematic diagram of an inductively coupled plasma etching apparatus including an oscillation circuit to externally control the $V_{pp}$ of the Faraday shield plate in accordance with one embodiment of the present invention.

FIG. 7B is a graph that shows $V_{pp}$ as a function of variable capacitor position for the inductively coupled plasma etching apparatus shown in FIG. 7A.

FIG. 8A is a simplified schematic diagram of an inductively coupled plasma etching apparatus including a voltage divider circuit to externally control the $V_{pp}$ of the Faraday shield plate in accordance with another embodiment of the present invention.

FIG. 8B is a graph that shows $V_{pp}$ as a function of variable capacitor position for the inductively coupled plasma etching apparatus shown in FIG. 8A.

FIG. 9B is a graph that shows $V_{pp}$ as a function of low frequency RF power for the inductively coupled plasma etching apparatus shown in FIG. 9A.

DETAILED DESCRIPTION OF THE INVENTION

Figure 1A:
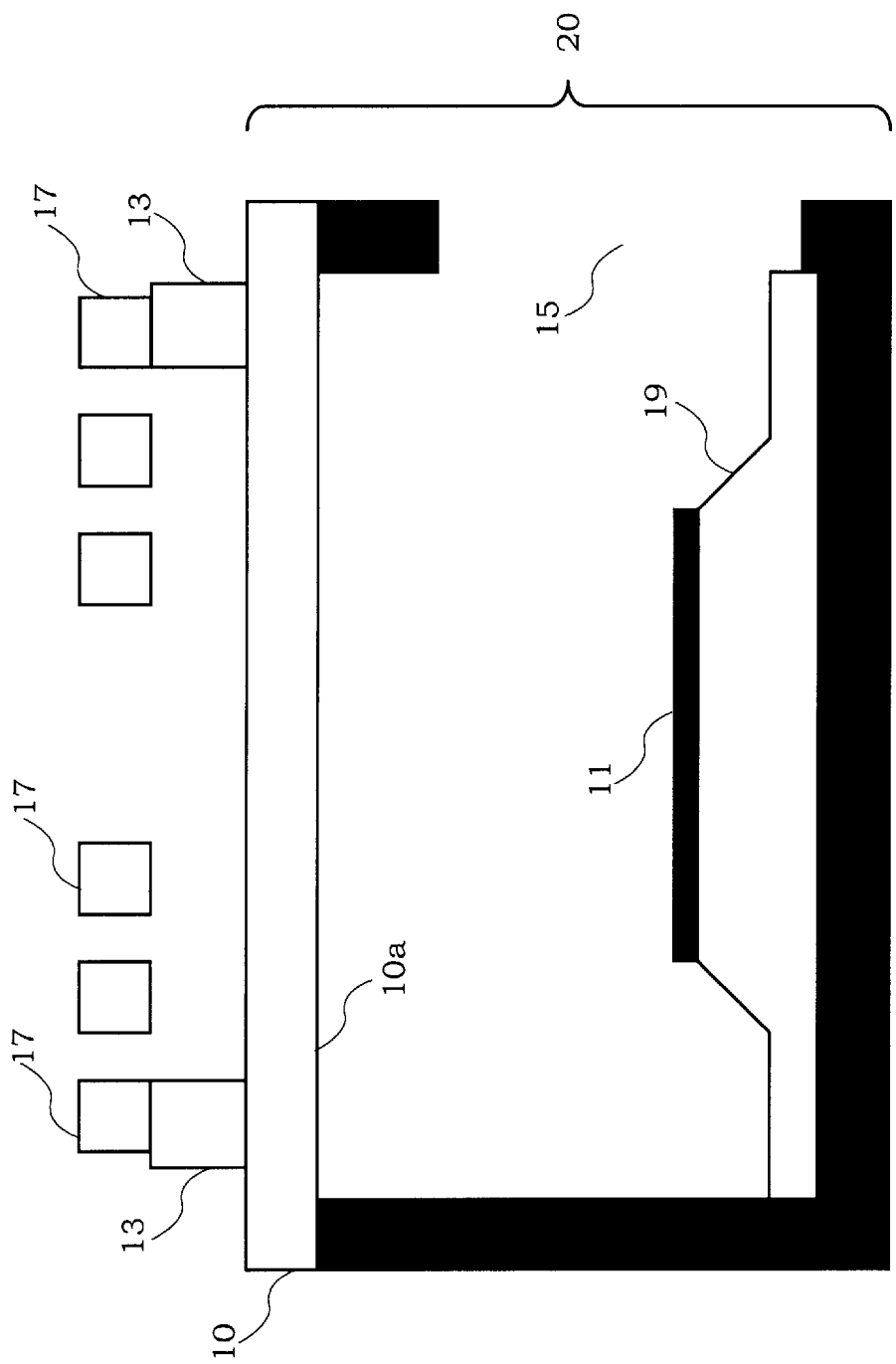
FIG. 1A is a simplified schematic cross-section showing a prior art inductively coupled plasma etching apparatus.
Figures 1B, 1C:
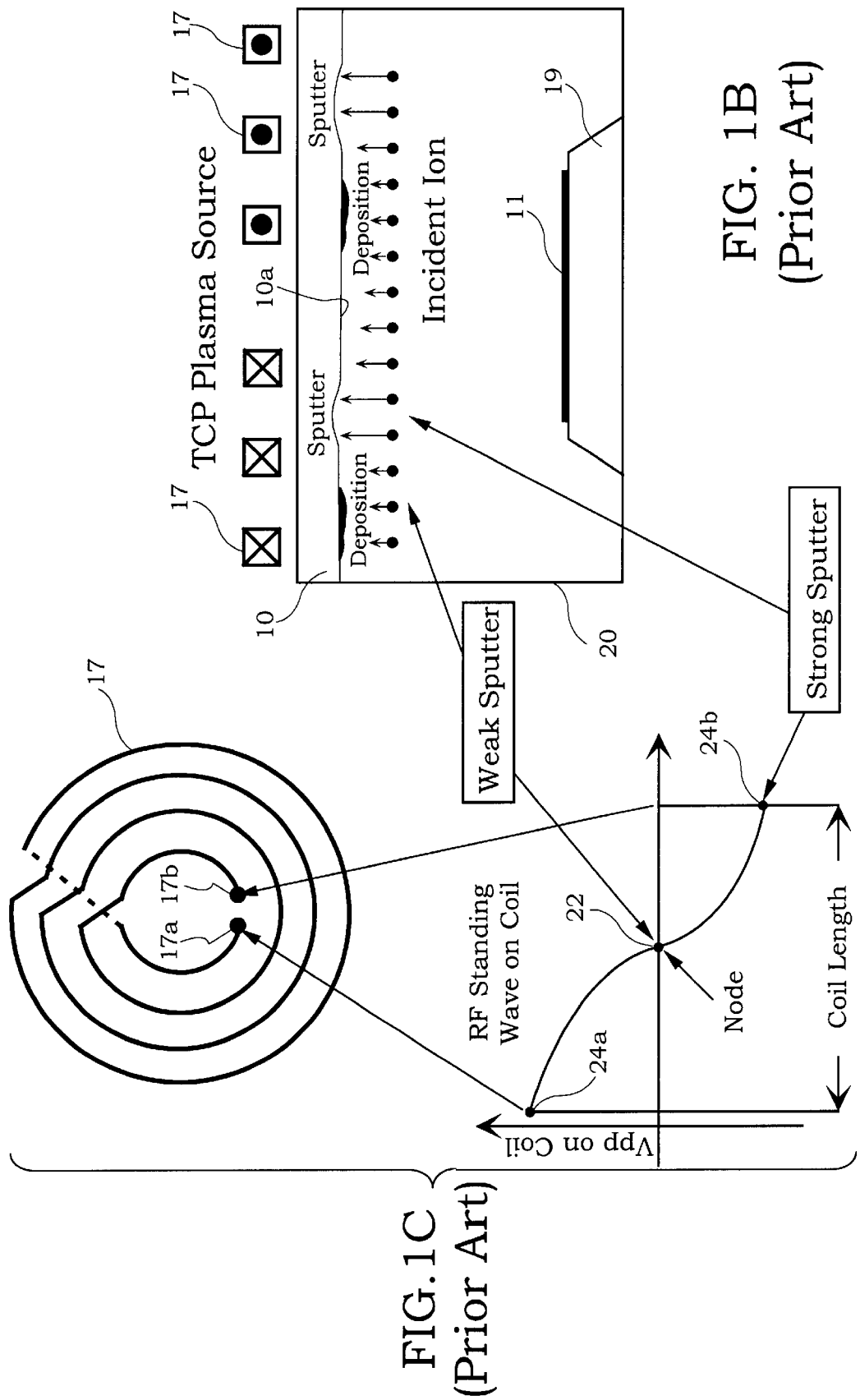
FIG. 1B is a simplified schematic diagram that illustrates the inherent nonuniformity of the deposition and sputtering on the TCP window in the inductively coupled plasma etching apparatus shown in FIG. 1A.
FIG. 1C is a graph that shows the $V_{pp}$ on the coil in the inductively coupled plasma etching apparatus shown in FIG. 1A as a function of coil length.

Several exemplary embodiments of the invention will now be described in detail with reference to the accompanying drawings. FIGS. 1A–1C are discussed above in the "Background of the Invention" section.

Figure 2A:
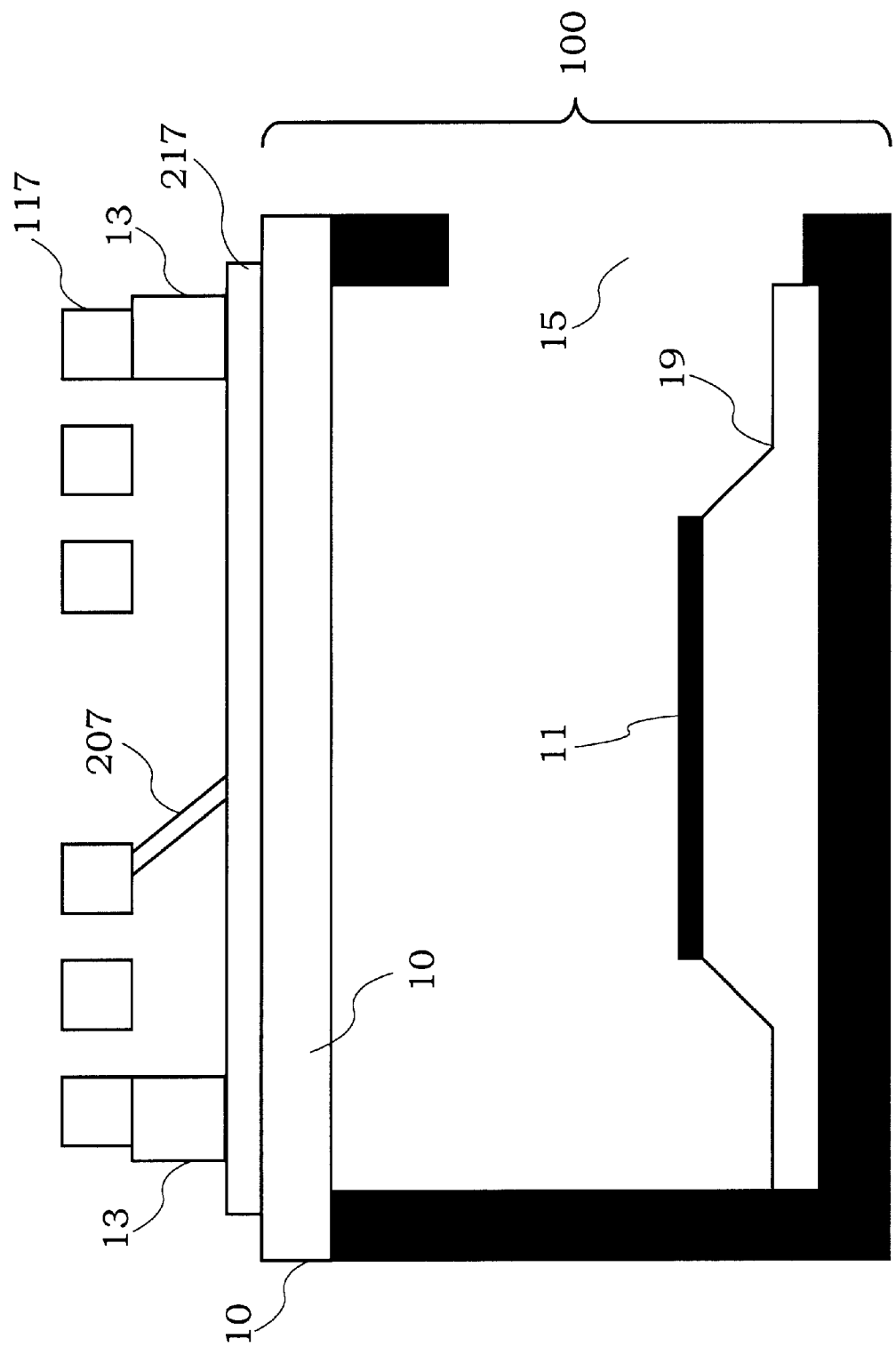
FIG. 2A is a simplified schematic cross-section showing an inductively coupled plasma etching apparatus in accordance with one embodiment of the present invention.

FIG. 2A is a simplified schematic cross-section showing an inductively coupled plasma etching apparatus in accordance with one embodiment of the present invention. As shown in FIG. 2A, semiconductor wafer 11 is mounted on chuck 19 disposed in chamber 100, which is defined by walls of a housing, proximate to a lower wall of the housing. Coil 117 is supported on TCP window 10 of chamber 100 by spacers 13, which may be formed of an insulating material. TCP window 10 is preferably made of quartz; however, other materials such as alumina ($Al_2O_3$), silicon nitride ($Si_3N_4$), aluminum nitride (AlN), silicon carbide (SiC), and silicon (Si) also may be used. The primary role of TCP window 10 is to provide a vacuum seal to chamber 100. In one embodiment, TCP window 10 is separated from wafer 11 by a distance that is between about 2 inches and about 8 inches, and more preferably between about 4 inches and about 5 inches. In operation, a reactant gas is fed into chamber 100 through a gas lead-in port (not shown). High frequency power from a power supply (not shown) is applied to coil 117. The high frequency (RF) current passing through coil 117 induces an electromagnetic current in chamber 100, and the electromagnetic current acts on the reactant gas to generate a plasma.

The plasma contains various types of radicals and the chemical reaction of the positive/negative ions is used to etch semiconductor wafer 11 itself or an insulation film formed on the wafer. During the etching process, coil 117 carries out a function that corresponds to that of the primary coil of a transformer while the plasma in chamber 100 carries out a function that corresponds to that of the secondary coil of the transformer. If the reaction product generated by the etching process is volatile, then this reaction product is discarded via exhaust port 15.

Metal plate 217, which acts as a Faraday shield, is provided between coil 117 and chamber 100. For ease of reference, metal plate 217 is also referred to herein as "the Faraday shield plate." In one embodiment, metal plate 217 is positioned in a spaced apart relationship between coil 117 and TCP window 10 and is substantially parallel to the TCP window. The thickness of metal plate 217 is preferably between about 20 μm and about 10 mm, and more preferably between about 50 μm and about 5 mm. In one embodiment, metal plate 217 has a thickness of about 1.5 mm. Connector 207 electrically connects metal plate 217 to coil 117 at a predetermined position of the coil and functions to ensure that the in-plane RF voltage applied to metal plate 217 is uniform. Because the in-plane RF voltage applied to metal plate 217 is uniform, energy is uniformly added to the plasma in the vicinity of TCP window 10. As a result of this uniform energy distribution, the deposition and sputtering of the reaction product occurs uniformly so that undesirable accumulation of the reaction product on TCP window 10 does not occur or is substantially eliminated.

In one embodiment, connector 207 electrically connects metal plate 217 to coil 117 at a position so that adequate $V_{pp}$ (peak-to-peak voltage) is applied on the metal plate. By uniformly applying $V_{pp}$ on metal plate 217, ions in the plasma are accelerated and uniformly bombard the vacuum side surface of a wall of the chamber of the inductively coupled plasma etching apparatus to prevent deposition of the reaction product thereon. In one embodiment, the inductively coupled plasma etching apparatus is a TCP 9400 PTX plasma etching apparatus, which is commercially available from Lam Research Corporation of Fremont, Calif., and the accelerated ions uniformly bombard the vacuum side surface of the TCP window to prevent deposition of the reaction product thereon. In an alternative embodiment, connector 207 electrically connects metal plate to a conductor extending from an impedance matching box to the coil.

Figures 2B, 2C:
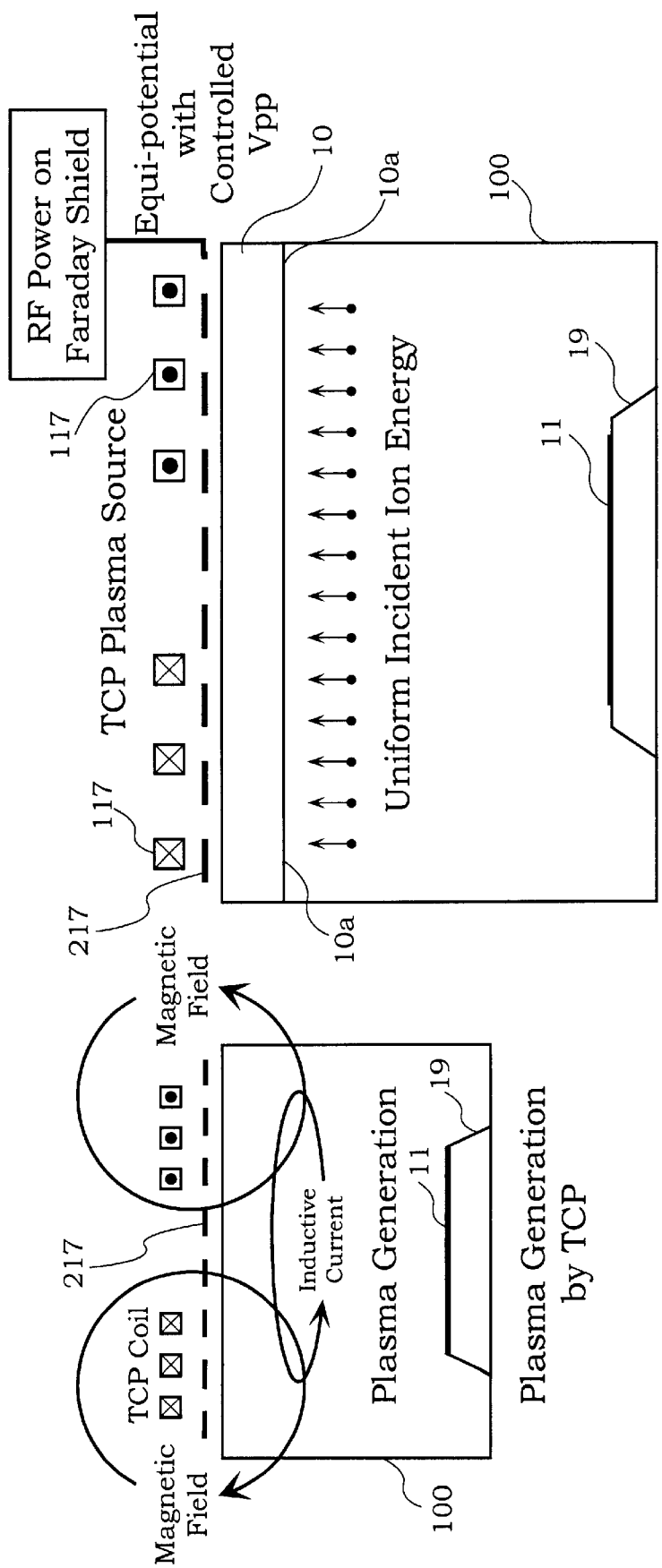
FIG. 2B is a simplified schematic cross-section that illustrates the plasma generation in an inductively coupled plasma etching apparatus in accordance with one embodiment of the invention.
FIG. 2C is a simplified schematic cross-section that illustrates the uniform window sputtering obtained by an inductively coupled plasma etching apparatus in accordance with one embodiment of the invention.

FIGS. 2B and 2C illustrate the uniform window sputtering obtained by an inductively coupled plasma etching apparatus in accordance with one embodiment of the invention. As shown in FIG. 2B, the application of an appropriate $V_{pp}$ to metal plate 217 through connector 207, which may be connected to coil 117 at the optimum location for a particular process, generates magnetic fields within chamber 100 that are uniform across the surface of metal plate 217. These uniform magnetic fields in turn induce a uniform electromagnetic current in chamber 100, and this inductive current acts on the reactant gas to generate a plasma. Because the inductive current is uniform across the surface of metal plate 217, the energy of the incident ions that bombard surface 10a of TCP window 10 also is uniform, as shown in FIG. 2C.

Figure 3:
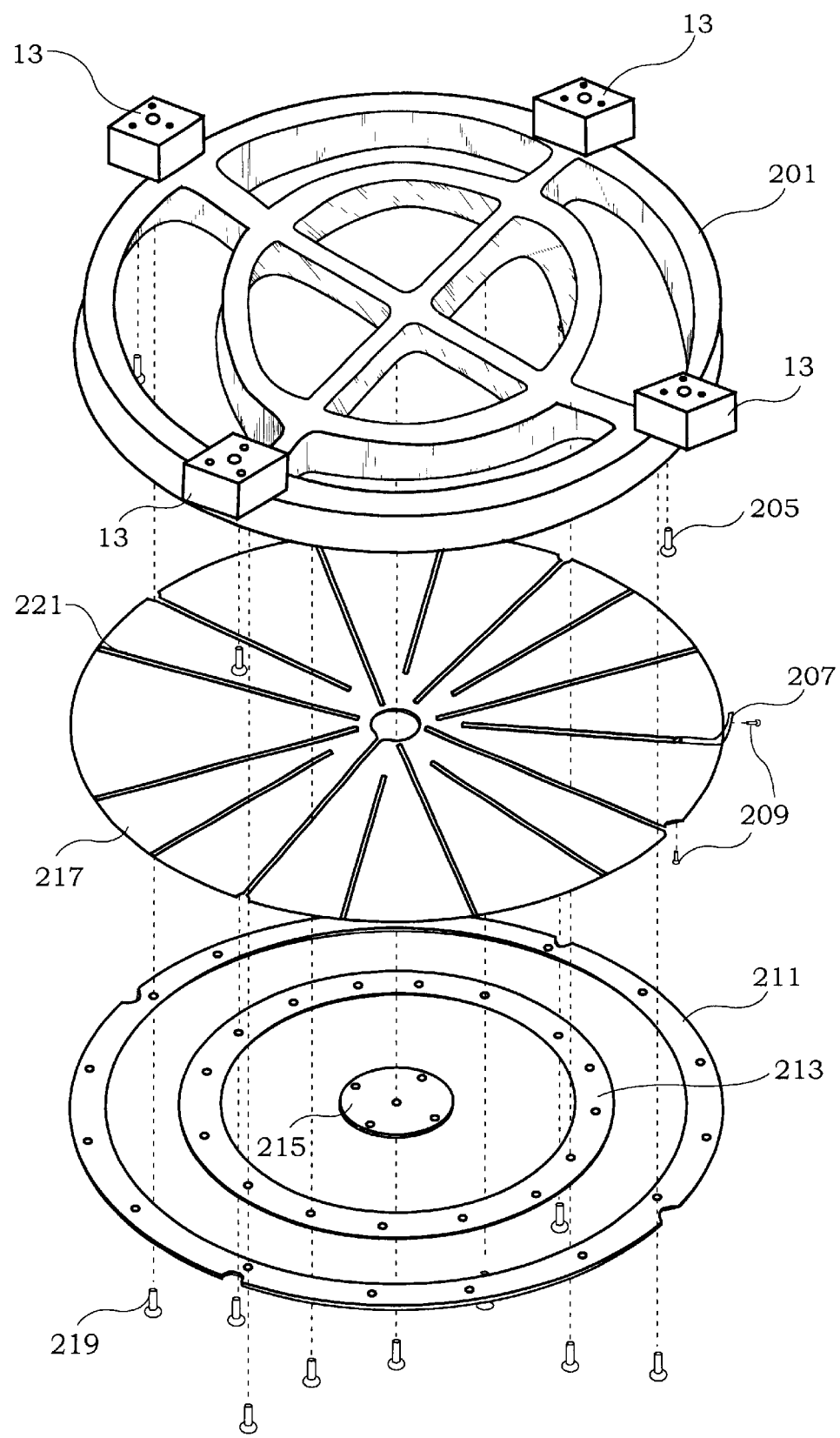
FIG. 3 is an exploded perspective view of a metal plate, which acts as a Faraday shield, and the components for holding the metal plate in place in accordance with one embodiment of the present invention.

FIG. 3 is an exploded perspective view of the metal plate, which acts as a Faraday shield, and the components for holding the metal plate in place in accordance with one embodiment of the invention. As shown in FIG. 3, metal plate 217 is secured to the underside of attachment frame 201, which is provided with attachment spacers 13 on a top side thereof, by screws 205. Attachment frame 201, attachment spacers 13, and screws 205 may be formed of any suitable insulating material.

Outer ring 211, inner ring 213, and center disk 215 are secured to attachment frame 201 by screws 219, which may be formed of any suitable insulating material. Outer ring 211, inner ring 213, and center disk 215 retain the shape of metal plate 217 during operation of the inductively coupled plasma etching apparatus. A plurality of radial slots 221 is formed in metal plate 217. Radial slots 221 extend transversely to the sections of coil 117 (see FIG. 4) to interrupt an internal induced power generated by electric current from flowing on metal plate 217, which is a conductor. This is necessary because electric current flowing on metal plate 217 causes coil 117 (see, e.g., FIGS. 2A and 4) and chamber 100 (see, e.g., FIG. 2A) to be electrically shielded.

Figure 4:
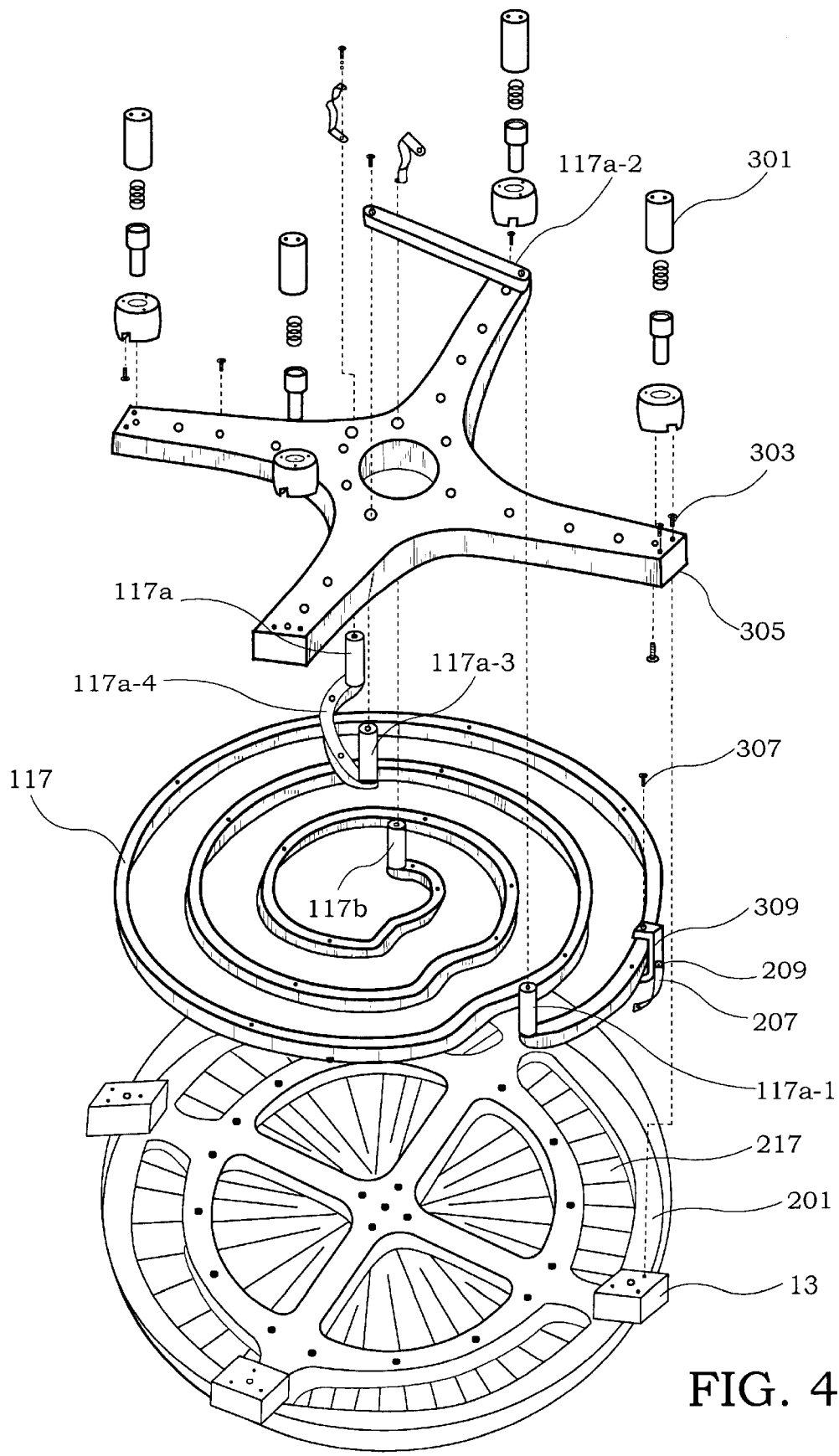
FIG. 4 is an exploded perspective view of a coil and the components for holding the coil in place in accordance with one embodiment of the present invention.

With continuing reference to FIG. 3, connector 207 electrically connects metal plate 217 and coil 117 (see, e.g., FIGS. 2A and 4). Two metal screws 209 are used to make this connection, with one metal screw connecting metal plate 217 to connector 207 and the other metal screw connecting coil 117 to connector 207.

FIG. 4 is an exploded perspective view of the coil and the components for holding the coil in place in accordance with one embodiment of the invention. As shown in FIG. 4, attachment frame 201 and attachment spacers 13 are provided between metal plate 217 and coil 117. The four ends of cross-shaped coil mounting plate 305 are fixed by support spring housings 301 and metal screws 303 to retain the shape of coil 117. As shown in FIG. 4, coil 117 has three turns. Coil 117 must have at least one turn, but otherwise may have any suitable number of turns as may be needed for the application.

As discussed above in connection with the description of FIG. 3, connector 207 electrically connects metal plate 217 to coil 117. As shown in FIG. 4, a U-shaped spacer 309 positions coil mounting plate 305, coil 117, and metal plate 217. U-shaped spacer 309 is connected to coil 117 by metal screw 307. One metal screw 209 electrically connects connector 207 to coil 117 through U-shaped spacer 309 and another metal screw 209 electrically connects connector 207 to metal plate 217 (see FIG. 3). As shown in FIG. 4, coil 117 is configured so that both the coil input terminal 117a and the coil output terminal 117b are situated proximate to the center of the coil 117. In particular, coil 117 includes coil end 117a-1 and coil output terminal 117b. Coil extension 117a-2 connects coil end 117a-1 to coil extension end 117a-3 of coil extension 117a-4. Coil input terminal 117a is at the other end of coil extension 117a-4. It will be apparent to those skilled in the art that the configuration of the coil may be varied from that shown in FIG. 4 in situations where it is not necessary to have both the coil input terminal and coil output terminal situated proximate to the center of the coil 117.

Figure 5:
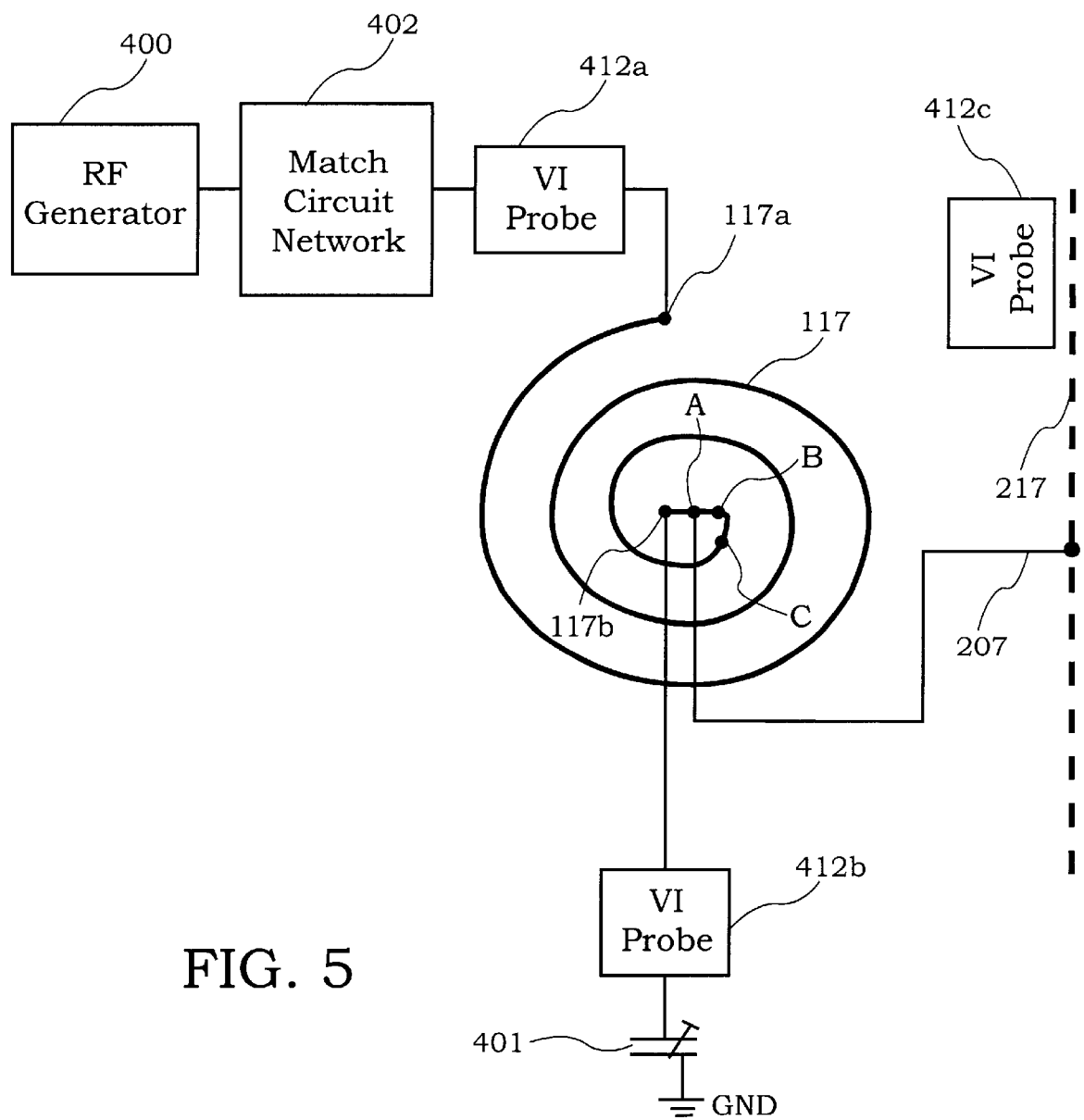
FIG. 5 is a simplified schematic diagram that shows the apparatus and the connection locations used in tests conducted to determine the optimal location at which to connect the Faraday shield plate to the coil for ruthenium (Ru) etching.

FIG. 5 is a simplified schematic diagram that shows the apparatus and the connection locations used in tests conducted to determine the optimal location at which to connect the Faraday shield plate to the coil for ruthenium (Ru) etching. As shown in FIG. 5, RF generator 400, match circuit network 402, and VI probe 412a are coupled to coil input terminal 117a of coil 117. Variable capacitor 401, which is grounded, and VI probe 412b are coupled to coil output terminal 117b of coil 117. During testing, metal plate 217, i.e., the Faraday shield plate, was coupled to coil 117 by connector 207 at locations A, B, and C and $V_{pp}$ was measured for each of these connection locations at coil input terminal 117a and coil output terminal 117b with VI probes 412a and 412b, respectively. In addition, $V_{pp}$ of metal plate 217 was measured for each of connection locations A, B, and C with VI probe 412c. VI probes 412a, 412b, and 412c are capacitive probes including a metal probe and a metal, e.g., copper, plate separated by a dielectric material, e.g., polyimide.

Figure 6A:
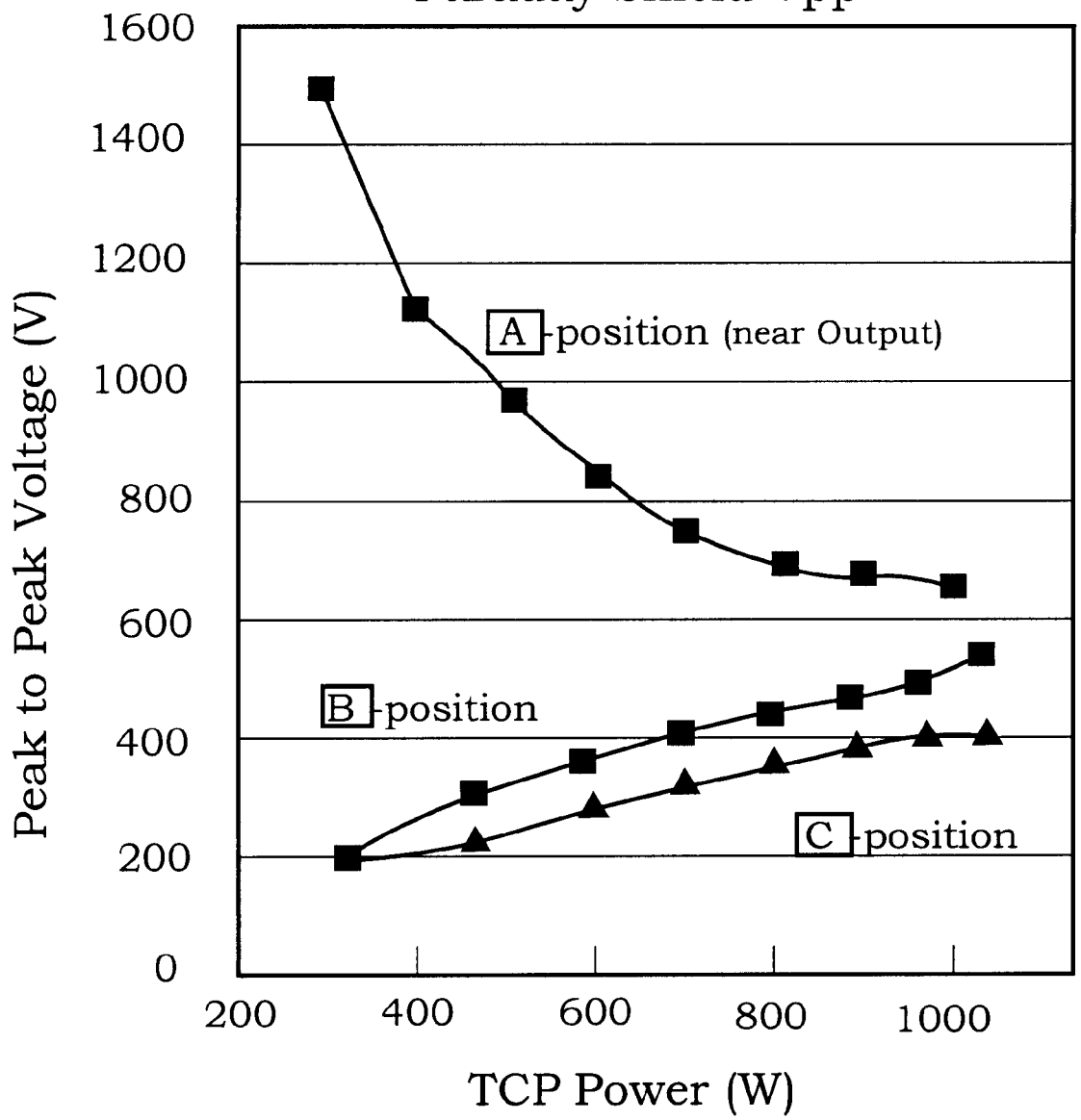
FIGS. 6A, 6B, and 6C are graphs showing the measured $V_{pp}$ as a function of TCP power for the Faraday shield plate, the coil terminal input, and the coil terminal output, respectively, for each of connection locations A, B, and C shown in FIG. 5.
Figure 6B:
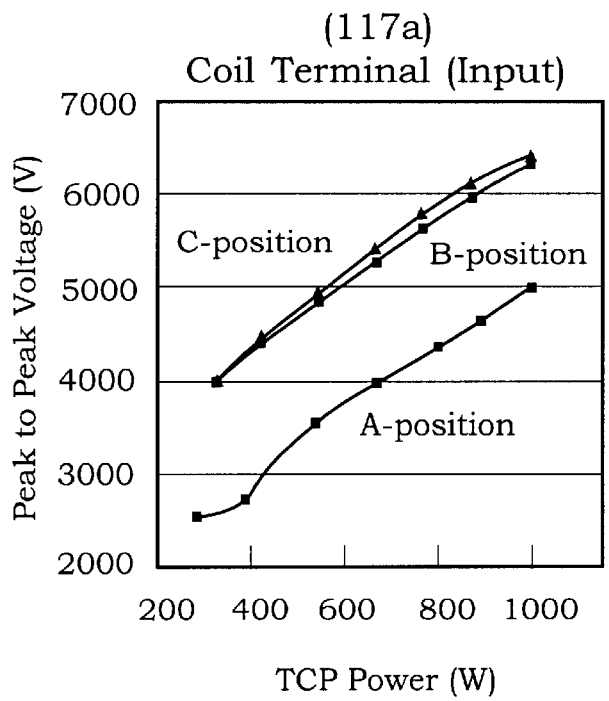
Figure 6C:
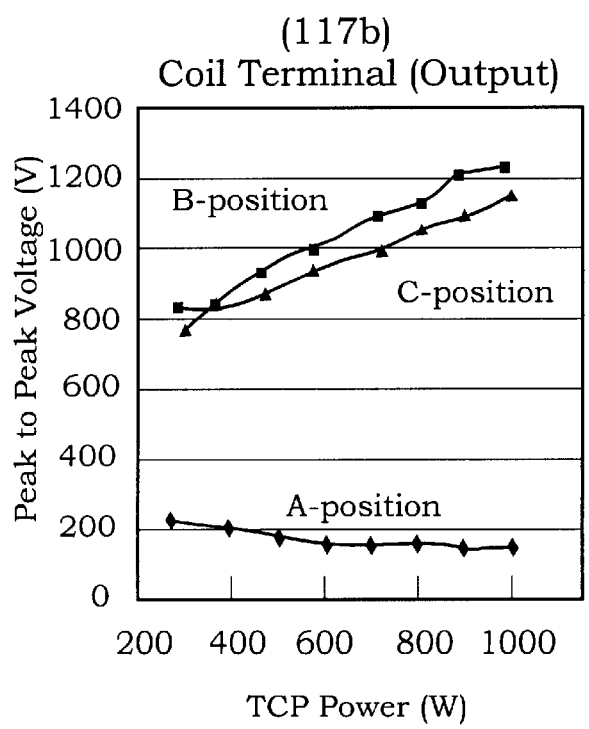

FIGS. 6A, 6B, and 6C are graphs showing the measured $V_{pp}$ as a function of TCP power for metal plate 217, coil input terminal 117a, and coil output terminal 117b, respectively, for each of connection locations A, B, and C shown in FIG. 5. As shown in FIG. 6A, for connection location A (near the output), $V_{pp}$ of metal plate 217 decreases significantly as the TCP power increases. For connection locations B and C, $V_{pp}$ of metal plate 217 increases slightly as the TCP power increases. As shown in FIG. 6B, for each of connection locations A, B, and C, $V_{pp}$ at coil input terminal 117a increases significantly as the TCP power increases. As shown in FIG. 6C, for connection location A, $V_{pp}$ at coil output terminal 117b decreases slightly as the TCP power increases. For connection locations B and C, $V_{pp}$ at coil output terminal 117b increases significantly as the TCP power increases.

Referring back to FIG. 6A, connection location A yielded a $V_{pp}$ of 676 volts at 800 watts for metal plate 217. During testing, the TCP window remained clean, but there was too much sputtering. Micromasking of ruthenium was observed with a blasted quartz window, but was resolved by replacing the blasted quartz window with a polished window. Connection location B yielded a $V_{pp}$ of 464 volts at 800 watts. During testing, no etch byproduct deposition was observed on the TCP window after the equivalent of approximately one lot of wafers was subjected to ruthenium etching. Connection location C yielded a $V_{pp}$ of 373 volts at 800 watts. During testing, a light deposition was observed on the TCP window after several wafers were etched. Thus, for a ruthenium etch process, the foregoing test results demonstrate that connection location B is superior to connection locations A and C.

The Faraday shield plate of the present invention is well suited for single step etch recipes where the RF peak-to-peak voltage and the RF matching can be optimized for the specific etching recipe. Many etching recipes, however, include multiple etching steps, e.g., the breakthrough step, the bulk etch steps, and the over etch step, in which the RF power, pressure, and gas compositions can be substantially different. Consequently, a certain setting of $V_{pp}$ on the Faraday shield plate (e.g., connection location) for a given etch step may not be optimal in other etch steps. Further, because the etching chamber impedance varies for different etch steps, RF tuning to satisfy the various impedances can be difficult. For an etch recipe that includes multiple etch steps, each individual etch process can be optimized by selecting just the right connection point to substantially eliminate deposition of materials on the quartz window. By way of example, such optimization can be reached in a manner similar to that which yielded the selection of connection location B, as described above with reference to FIG. 5. In that example, the points A, B, and C were selected to be about 25 mm from the coil output terminal, about 80 mm from the coil output terminal, and about 140 mm from the coil output terminal, respectively. Of course, it will be apparent to those skilled in the art that these locations can and will change depending on the recipe used to etch a given material and the combination of matching network element settings.

FIG. 7A is a simplified schematic diagram of an inductively coupled plasma etching apparatus including an oscillation circuit to externally control the $V_{pp}$ of the Faraday shield plate in accordance with one embodiment of the present invention. As shown in FIG. 7A, RF generator 400 and match circuit network 402 are coupled to coil input terminal 117a of coil 117. Variable capacitor 401, which is grounded, is coupled to coil output terminal 117b of coil 117. Metal plate 217 is connected to coil 117 and to shield box 406, which defines an oscillation circuit including variable capacitor 408 and inductor 409. Variable capacitor 408 and inductor 409 are grounded. With this configuration, the $V_{pp}$ of metal plate 217 can be controlled by adjusting the position of the variable capacitor of the oscillation circuit. As shown in FIG. 7B, the maximum $V_{pp}$ occurs at the harmonic point.

FIG. 8A is a simplified schematic diagram of an inductively coupled plasma etching apparatus including a voltage divider circuit to externally control the $V_{pp}$ of the Faraday shield plate in accordance with another embodiment of the present invention. As shown in FIG. 8A, RF generator 400 and match circuit network 402 are coupled to coil input terminal 117a of coil 117. Variable capacitor 401, which is grounded, is coupled to coil output terminal 117b of coil 117. Metal plate 217 is connected to coil 117 via voltage divider circuit 416, which includes coupling capacitor 416a and variable capacitor 416b. Metal plate 217 is connected to voltage divider circuit 416 such that coupling capacitor 416a is disposed between coil 117 and the metal plate and variable capacitor 416b is disposed between the metal plate and ground. With this configuration, the $V_{pp}$ of metal plate 217 can be controlled by adjusting the position of the variable capacitor of the voltage divider circuit. As shown in FIG. 8B, $V_{pp}$ is proportional to the divide ratio of the voltage divider circuit.

On one hand, the configurations for externally controlling the $V_{pp}$ of the Faraday shield plate shown in FIGS. 7A and 8A are desirable because they are simple and inexpensive. On the other hand, these configurations may affect TCP matching. In this regard, the configuration shown in FIG. 7A affects TCP matching to a lesser extent than does the configuration shown in FIG. 8A.

Figure 9A:
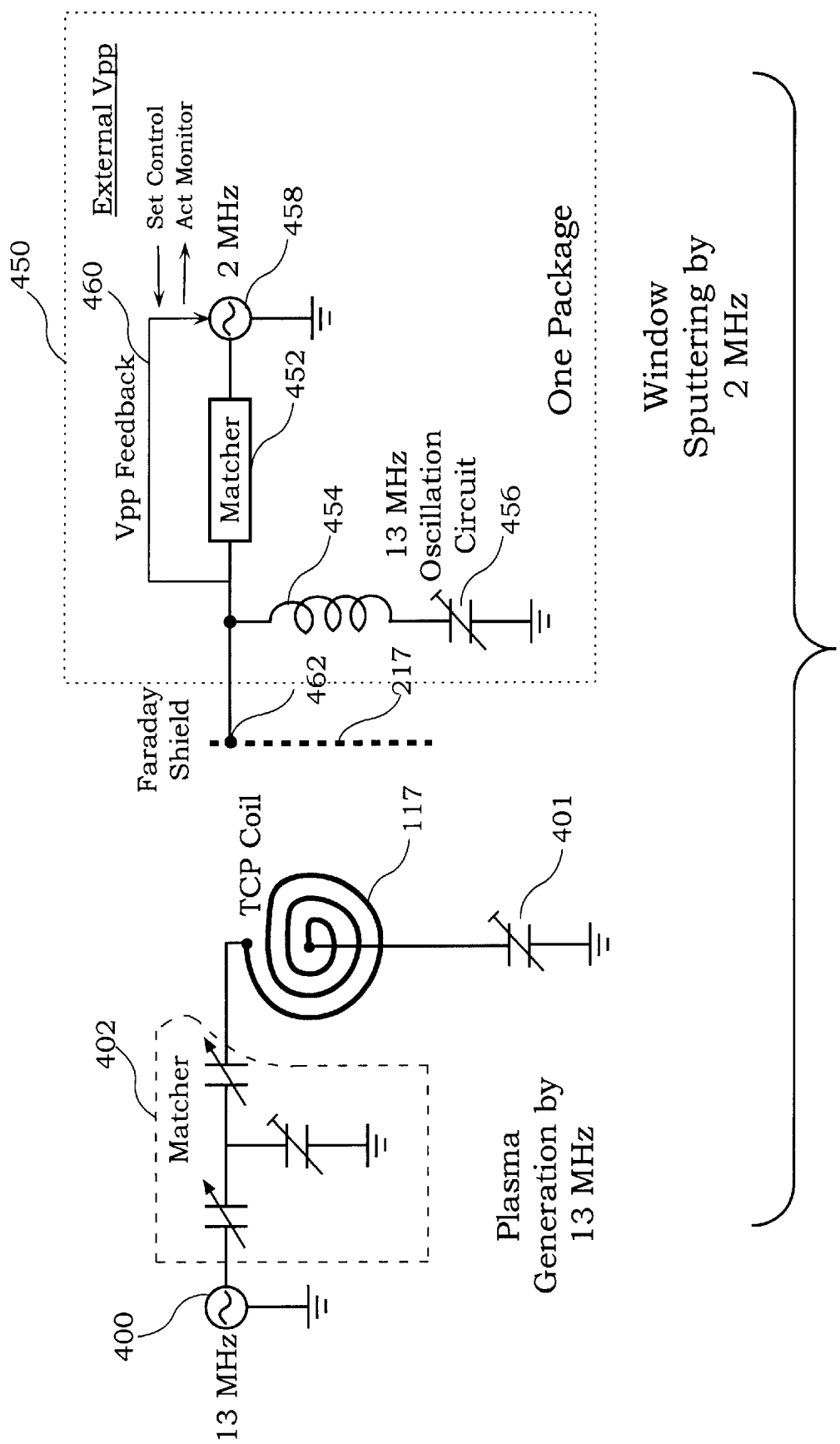
FIG. 9A is a simplified schematic diagram of an inductively coupled plasma etching apparatus in which the Faraday shield plate is driven by a different frequency in accordance with yet another embodiment of the present invention.

FIG. 9A is a simplified schematic diagram of an inductively coupled plasma etching apparatus in which the Faraday shield plate is independently driven by a different frequency in accordance with yet another embodiment of the present invention. As shown in FIG. 9A, RF generator 400 and match circuit network 402 are coupled to coil input terminal 117a of coil 117. Variable capacitor 401, which is grounded, is coupled to coil output terminal 117b of coil 117. Metal plate 217 is coupled to Faraday shield driver 450 at connection point 462. Faraday shield driver 450 is essentially a controller that enables monitoring of applied peak-to-peak voltages at different TCP power settings and on-the-fly adjustments to achieve the most optimal performance without dependence on the matching circuitry of coil 117. This is true because no connection is made between the coil and the metal plate in this exemplary embodiment. As shown in FIG. 9A, Faraday shield driver 450 includes matching circuit 452, a 13.56 MHz oscillation circuit that includes inductor 454 and variable capacitor 456, RF generator 458, and $V_{pp}$ feedback loop 460.

In operation, RF power from RF generator 458, which is grounded, is applied to metal plate 217. The RF power is preferably in a range from about 50 KHz to about 50 MHz, and more preferably in a range from about 100 KHz to just below 13.56 MHz. In one embodiment, the RF power is about 2 MHz. The 13.56 MHz oscillation circuit, which is coupled to metal plate 217, acts to "ground" the metal plate from a 13.56 MHz point of view. Stated differently, the 13.56 MHz oscillation circuit shuts out the interruption from the RF power applied to metal plate 217 by RF generator 400.

The $V_{pp}$ feedback 460 is preferably provided back to RF generator 458 for comparison with an external $V_{pp}$ value. Based on this comparison, adjustments can be made to RF generator 458 so that the most optimal $V_{pp}$ level can be applied to the Faraday shield plate. In a preferred embodiment, the monitoring of the applied $V_{pp}$ can be controlled by way of a computer control station. The computer control station can provide a user with statistical operational data by way of a text display, a graphical user interface (GUI), or printouts. Based on this statistical data, the operator can make further adjustments so as to achieve the most optimal performance and thus eliminate the deposition of byproducts on the inner chamber walls such as, for example, the TCP window inner surface. Accordingly, with the configuration of FIG. 9A, the $V_{pp}$ of metal plate 217 can be controlled by adjusting the low frequency RF power applied to the metal plate. As shown in FIG. 9B, $V_{pp}$ increases as the low frequency RF power increases. Therefore, in this exemplary embodiment, there is no need to have a fixed connection point to coil 117.

Figure 10:
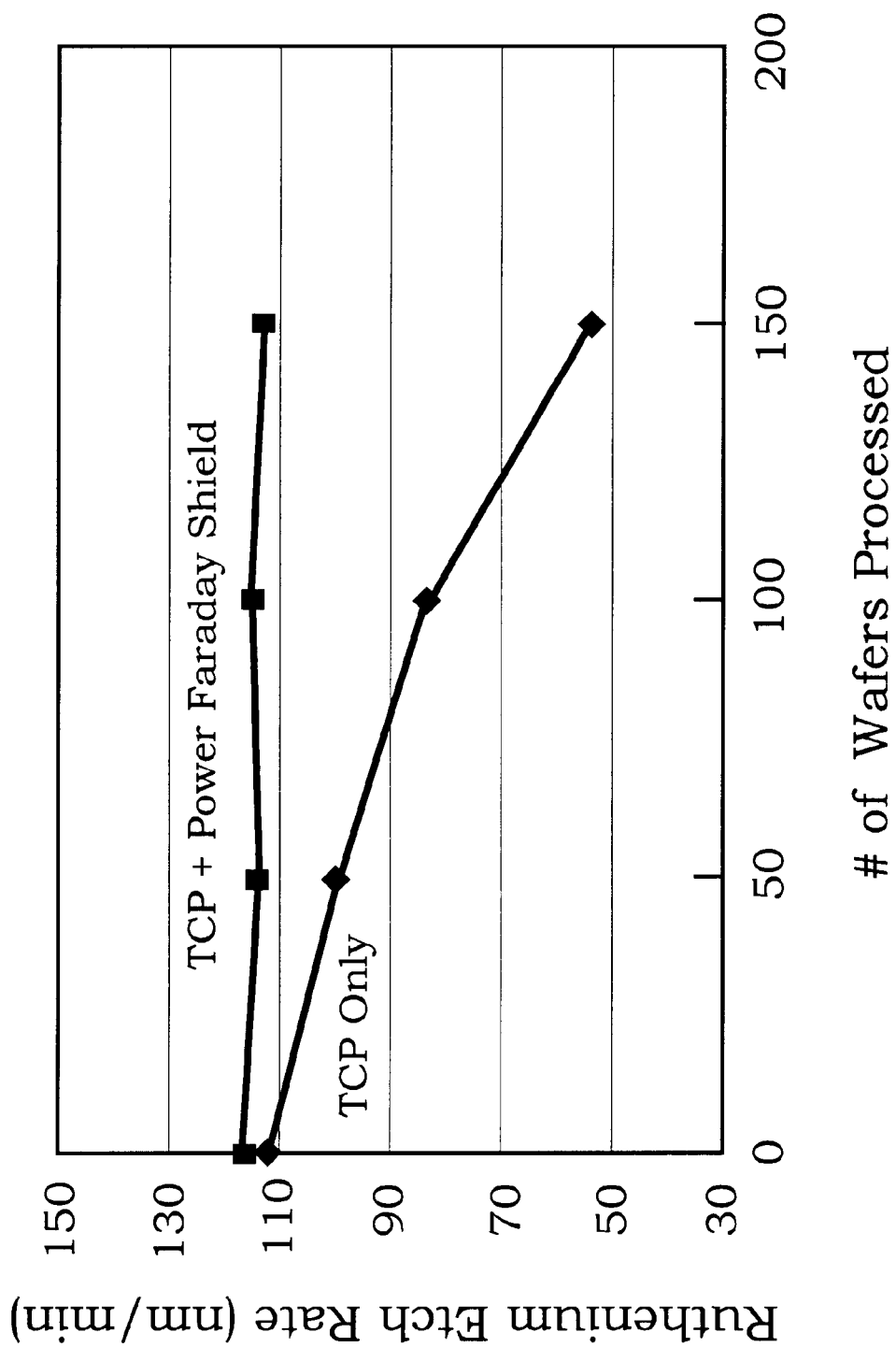
FIG. 10 is a graph that shows the ruthenium etch rate as a function of the number of wafers processed in a conventional inductively coupled plasma etching apparatus and an inductively coupled plasma etching apparatus having a Faraday shield plate that is coupled to the coil in accordance with the present invention.

FIG. 10 is a graph that shows the ruthenium etch rate as a function of the number of wafers processed in a conventional inductively coupled plasma etching apparatus and an inductively coupled plasma etching apparatus having a Faraday shield plate that is coupled to the coil in accordance with the present invention. As shown in FIG. 10, in a conventional inductively coupled plasma etching apparatus, the ruthenium etch rate decreases by about 50% after 150 wafers have been processed. In contrast, in an inductively coupled plasma etching apparatus having a Faraday shield coupled to the coil in accordance with the present invention, the ruthenium etch rate after 150 wafers have been processed is substantially the same as the initial etch rate. Thus, the Faraday shield plate of the present invention provides a highly reproducible ruthenium etch rate.

The present invention also provides a method for controlling an inner surface of a wall defining a chamber in which a plasma is generated in an inductively coupled plasma etching apparatus. In this method, a metal plate is provided between a coil for receiving high frequency (RF) power and the plasma generated in the chamber such that the metal plate does not contact the coil. The metal plate has a plurality of metal slits formed therein that extend transversely to the coil and is electrically connected to the coil, as described above. A plasma etching operation is conducted in the inductively coupled plasma etching apparatus. During the plasma etching operation, the deposition of a reaction product on an inner surface of a wall positioned between the metal plate and the plasma and the sputtering of the reaction product from the inner surface of the wall are substantially uniform so that an amount of the reaction product sufficient to disable the plasma etching operation does not accumulate on the inner surface of the wall. In one embodiment, the wall positioned between the metal plate and the plasma is an upper wall of the chamber, e.g., a TCP window.

The present invention further provides methods for optimizing operation of an inductively coupled plasma etching apparatus. In these methods, a chamber for etching a wafer is supplied. A window is attached to a top opening of the chamber. The window has an outer surface and an inner surface that is exposed to an inner region of the chamber. A coil is placed over the window and a metal plate is placed over the outer surface of the window. The metal plate is positioned in a spaced apart relationship between the coil and the outer surface of the window. In accordance with a first optimization method, the metal plate is connected to a connection location on the coil. The connection location is between an input terminal and an output terminal and is optimally selected so as to produce substantially uniform incident ion energy proximate to the inner surface of the window. The substantially uniform incident ion energy is configured to reduce sputtering of the inner surface of the window while substantially simultaneously preventing deposition of etch byproducts on the inner surface of the window. In accordance with a second optimization method, a controlled peak-to-peak voltage is applied to the metal plate so as to produce substantially uniform incident ion energy proximate to the inner surface of the window. Again, the substantially uniform incident ion energy is configured to reduce sputtering of the inner surface of the window while substantially simultaneously preventing deposition of etch byproducts on the inner surface of the window.

The inductively coupled plasma etching apparatus of the present invention is well suited for plasma etching of recently developed device materials (e.g., platinum, ruthenium, and the like) that generate nonvolatile, electrically conductive reaction products (e.g., $RuO_2$). It will be apparent to those skilled in the art that the inductively coupled plasma etching apparatus of the present invention also may be used to plasma etch standard materials such as metal and polysilicon. In the plasma etching of metal and polysilicon, $V_{pp}$ is adjusted to realize uniform and minimum deposition. In this manner, the mean wafer between clean (MWBC) and the lifetime of the TCP window may be improved.

It will be apparent to those skilled in the art that the precise control of $V_{pp}$ and the resulting balance of sputtering and deposition on the TCP window provided by the apparatus and methods of the present invention provide numerous other advantages including the reduction of problems associated with particles and contamination, etch profile control (by controlling the etch sidewall deposition coming from the plasma and the TCP window), etch selectivity control, and selective etch byproduct deposition. In the case of selective etch byproduct deposition, this can be done by tuning $V_{pp}$ so that materials having certain sticking coefficients and sputtering yields can be captured on the TCP window to control etching, provided the surface of the TCP window is maintained at a relatively constant temperature.

In summary, the present invention provides an inductively coupled plasma etching apparatus and methods for optimizing the operation of an inductively coupled plasma etching apparatus. The invention has been described herein in terms of several preferred embodiments. Other embodiments of the invention will be apparent to those skilled in the art from consideration of the specification and practice of the invention. For example, the location at which the Faraday shield plate is connected to the coil may be varied from the exemplary locations shown and described herein to optimize a particular etch process. The embodiments and preferred features described above should be considered exemplary, with the scope of the invention being defined by the appended claims and their equivalents.

What is claimed is:

1. An inductively coupled plasma etching apparatus, comprising:
    a chamber;
    a window for sealing a top opening of the chamber, the window having an inner surface that is exposed to an internal region of the chamber;
    a metal plate disposed above and spaced apart from the window;
    a coil disposed above the metal plate, the coil being spaced part from the metal plate, and the coil being conductively connected to the metal plate at a connection location that is configured to generate a peak-to-peak voltage on the metal plate that optimally reduces sputtering of the inner surface of the window while substantially simultaneously preventing deposition of etch byproducts on the inner surface of the window; and
    an oscillation circuit coupled to the metal plate, the oscillation circuit being controllable to further adjust the peak-to-peak voltage on the metal plate.

2. An inductively coupled plasma etching apparatus as recited in claim 1, wherein the coil further comprises:
    a coil input terminal for receiving RF power; and
    a coil output terminal, the connection location being defined between the coil input terminal and the coil output terminal.

3. An inductively coupled plasma etching apparatus as recited in claim 2, wherein the connection location is more proximate to the coil output terminal than to the coil input terminal.

4. An inductively coupled plasma etching apparatus as recited in claim 2, further comprising:
    an RF generator;
    a match circuit network, the match circuit network being coupled between the RF generator and the coil input terminal; and
    a variable capacitor coupled between ground and the coil output terminal.

5. An inductively coupled plasma etching apparatus as recited in claim 1, wherein the oscillation circuit includes a variable capacitor that can be adjusted to control the peak-to-peak voltage along a harmonic point.

6. An inductively coupled plasma etching apparatus, comprising:

a chamber;

a window for sealing a top opening of the chamber, the window having an inner surface that is exposed to an internal region of the chamber;

a metal plate disposed above and spaced apart from the window;

a coil disposed above the metal plate, the coil being spaced part from the metal plate; and a controller for externally applying a peak-to-peak voltage to the metal plate, the controller including an oscillation circuit, a matching circuit, an RF generator, and a feedback control for monitoring the applied peak-to-peak voltage.

7. An inductively coupled plasma etching apparatus as recited in claim 1, wherein the chamber further includes:

a chamber lid, the chamber lid being configured to have attached thereto the metal plate and the coil, the chamber lid being attached by hinges that enable opening and closing of the chamber lid.

8. An inductively coupled plasma etching apparatus as recited in claim 7, wherein the chamber lid in a closed position places the metal plate proximate to the window in preparation for operation.

9. An inductively coupled plasma etching apparatus, comprising:

a chamber;

a window for sealing a top opening of the chamber, the window having an inner surface that is exposed to an internal region of the chamber;

a metal plate disposed above and spaced apart from the window;

a coil disposed above the metal plate, the coil being spaced part from the metal plate, and the coil being conductively connected to the metal plate at a connection location that is configured to generate a peak-to-peak voltage on the metal plate that optimally reduces sputtering of the inner surface of the window while substantially simultaneously preventing deposition of etch byproducts on the inner surface of the window; and a voltage divider circuit coupled to the metal plate, the voltage divider circuit being controllable to further adjust the peak-to-peak voltage on the metal plate.

10. An inductively coupled plasma etching apparatus as recited in claim 9, wherein the voltage divider circuit includes a variable capacitor that can be adjusted to control the peak-to-peak voltage along a plot that decreases the peak-to-peak voltage as capacitance of the variable capacitor increases.

11. An inductively coupled plasma etching apparatus as recited in claim 6, wherein the externally applied peak-to-peak voltage is adjustable so as to reduce sputtering of the inner surface of the window while substantially simultaneously preventing deposition of etch byproducts on the inner surface of the window.

12. An inductively coupled plasma etching apparatus as recited in claim 11, wherein the coil further comprises:

a coil input terminal for receiving RF power; and a coil output terminal.

13. An inductively coupled plasma etching apparatus as recited in claim 12, further comprising:

an RF generator;

a match circuit network, the match circuit network being coupled between the RF generator and the coil input terminal; and a variable capacitor coupled between ground and the coil output terminal.

14. An inductively coupled plasma etching apparatus as recited in claim 12, wherein the metal plate is connected to the window by dielectric spacers.

15. An inductively coupled plasma etching apparatus as recited in claim 6, wherein the chamber further includes:

a chamber lid, the chamber lid being configured to have attached thereto the metal plate and the coil, the chamber lid being attached by hinges that enable opening and closing of the chamber lid.

16. An inductively coupled plasma etching apparatus as recited in claim 15, wherein the chamber lid in a closed position places the metal plate proximate to the window in preparation for operation.

17. An inductively coupled plasma etching apparatus as recited in claim 15, wherein the chamber lid in an open position places the metal plate away from the window for visual inspection of the window and servicing of the chamber.

* * * * *